(12) United States Patent
Kim et al.

(10) Patent No.: US 6,229,118 B1
(45) Date of Patent: May 8, 2001

(54) WAFER HANDLING APPARATUS FOR TRANSFERRING A WAFER TO AND FROM A PROCESS CHAMBER

(75) Inventors: Jae Pil Kim, Suwon; Yong Joon Cheong, Seoul, both of (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/546,532

(22) Filed: Apr. 10, 2000

(30) Foreign Application Priority Data

Aug. 25, 1999 (KR) .................................................. 99-35498

(51) Int. Cl.⁷ .............................. H05B 3/68; C23C 16/00
(52) U.S. Cl. ........................................ 219/444.1; 118/724
(58) Field of Search .............................. 219/443.1, 444.1, 219/552, 553; 118/715, 716, 719, 723 UE, 724, 725, 727, 728, 729, 730

(56) References Cited

U.S. PATENT DOCUMENTS

| | | | |
|---|---|---|---|
| 4,592,306 | * 6/1986 | Gallego ................................ | 118/719 |
| 5,252,807 | * 10/1993 | Chizinsky ............................ | 118/724 |
| 5,516,283 | 5/1996 | Schrems . | |
| 5,567,267 | * 10/1996 | Kazama et al. ....................... | 118/724 |
| 5,667,592 | * 9/1997 | Boitnott et al. ....................... | 118/719 |
| 5,679,165 | * 10/1997 | Maeda et al. ......................... | 118/719 |
| 5,746,565 | 5/1998 | Tepolt . | |
| 5,951,770 | * 9/1999 | Perlov ................................... | 118/719 |
| 6,004,047 | * 12/1999 | Akimoto et al. ....................... | 118/52 |
| 6,087,632 | * 7/2000 | Mizosaki et al. ..................... | 118/725 |

* cited by examiner

Primary Examiner—Sang Paik
(74) Attorney, Agent, or Firm—Jones Volentine, LLC (57) ABSTRACT

A wafer handling apparatus prevents polymers from sticking to the handler which conveys a wafer into/from a process chamber in which the wafer is treated. The wafer handler has an arm which is rotatably driven and an effector integral with the arm. The wafer is supported on the effector via a vacuum chuck formed by vacuum holes in the effector. The temperature of the handler is controlled to be identical to that inside the process chamber. The temperature controlling system has an electric heater for heating the effector and a current supplying apparatus which intermittently supplies current to the heater to maintain the temperature of the effector. Because the temperature of the handler is maintained at least as high as that inside the process chamber, polymers floating in the process chamber are prevented from sticking to the handler.

20 Claims, 6 Drawing Sheets

WAFER HANDLING APPARATUS FOR TRANSFERRING A WAFER TO AND FROM A PROCESS CHAMBER

BACKGROUND OF THE INVENTION

1. Field of the Invention

The present invention relates to a wafer handling apparatus of a semiconductor treatment system. More particularly, the present invention relates to a wafer handling apparatus capable of conveying a wafer into a process chamber and/or withdrawing the wafer from the process chamber while the wafer treatment processing is being carried out.

2. Description of the Related Art

In general, a semiconductor treatment system has a process chamber and a handler which conveys a wafer into the process chamber and/or withdraws the wafer from the process chamber. An example of such a handler is disclosed in U.S. Pat. No. 5,746,565 (issued to Tepolt on May 5, 1998). The wafer conveyed into the process chamber is manufactured into a semiconductor device or semiconductor chip through a number of processes including lithography, chemical and physical deposition, and plasma etching processes.

Polymers are commonly generated in the process chamber while the above processes are being carried out. In particular, a significant amount of polymers are intentionally generated in the dry etch process so as to treat the wafer. Furthermore, polymers are inevitably generated in a CVD (chemical vapor deposition) process which forms, at a high temperature, a thin film of polycrystalline material, such as Si, $Si_3N_4$, and $SiO_2$, on the wafer disposed in the process chamber.

After the processes have been completed, most of the polymers are discharged out of the process chamber by a vacuum pump. However, some of the remaining polymers float and stick to the side wall of the process chamber having a relatively lower temperature. As a result, with the lapse of time, the amount of polymer on the side wall of the process chamber increases and form aggregates of polymer particles. Such polymer particles can drop onto the wafer being treated, thereby decreasing the quality of the semiconductor device. In addition, the side wall of the process chamber must be manually cleaned periodically in order to remove the polymer particles, resulting in a consumption of time and labor.

In order to overcome the above problem, a method of preventing polymer from sticking to the side wall of the process chamber by heating the side wall or periphery of the process chamber has been suggested. This method is based on the concept that polymers do not stick to high temperature objects. According to the above method, the side wall, lid or electrode installed in the process chamber is heated by a specially manufactured heater to prevent the polymers from sticking to the side wall of the process chamber.

One example of the heating method for the process chamber is disclosed in U.S. Pat. No. 5,516,283. According to the above patented heating method, the outer surface of the process chamber is directly heated by a heater. In addition, heating pads or heating tubes can be installed on the lid of the process chamber or on the side wall of the process chamber.

Figure 1:
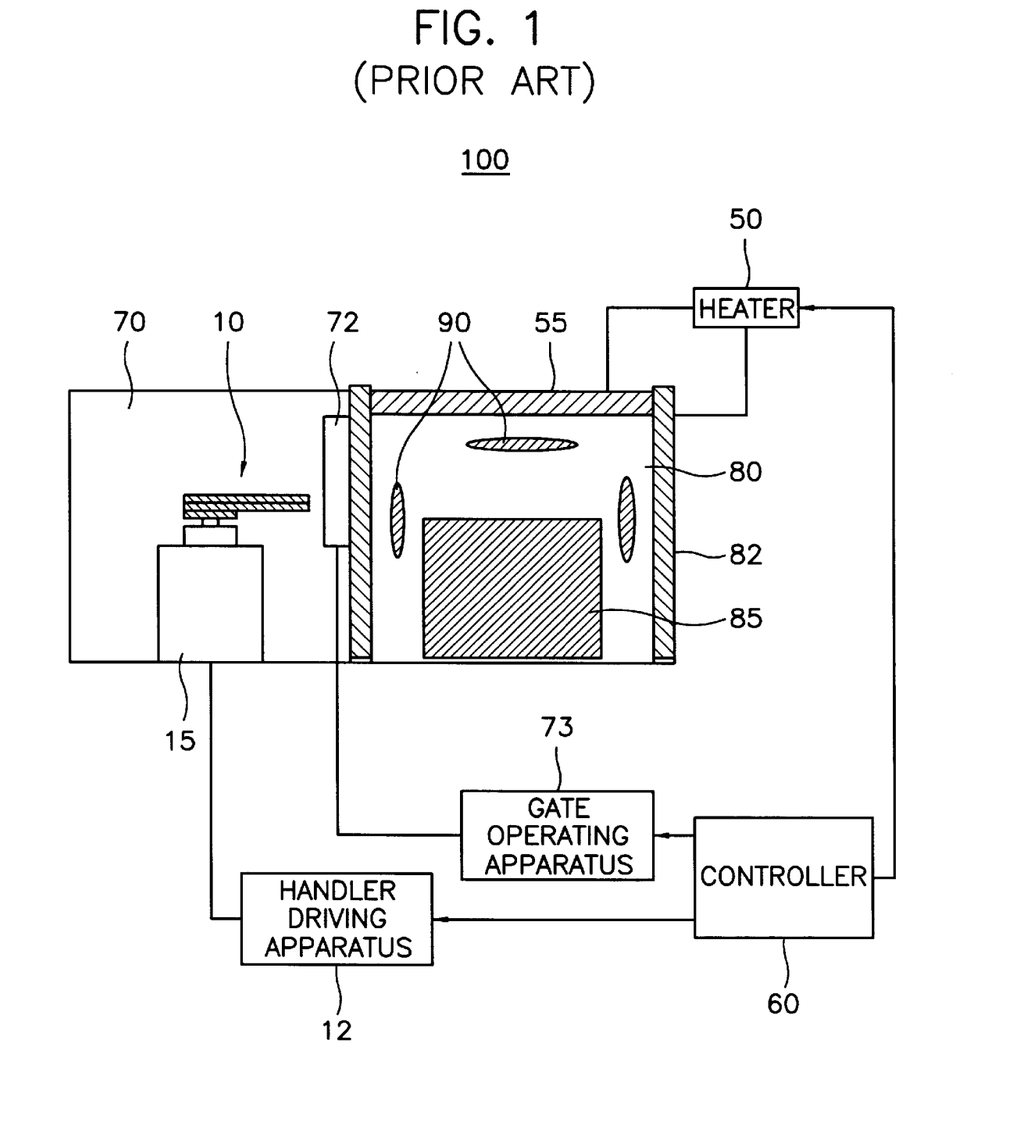
FIG. 1 is a schematic diagram of a conventional semiconductor treatment system equipped with a wafer handling apparatus.
Figure 2:
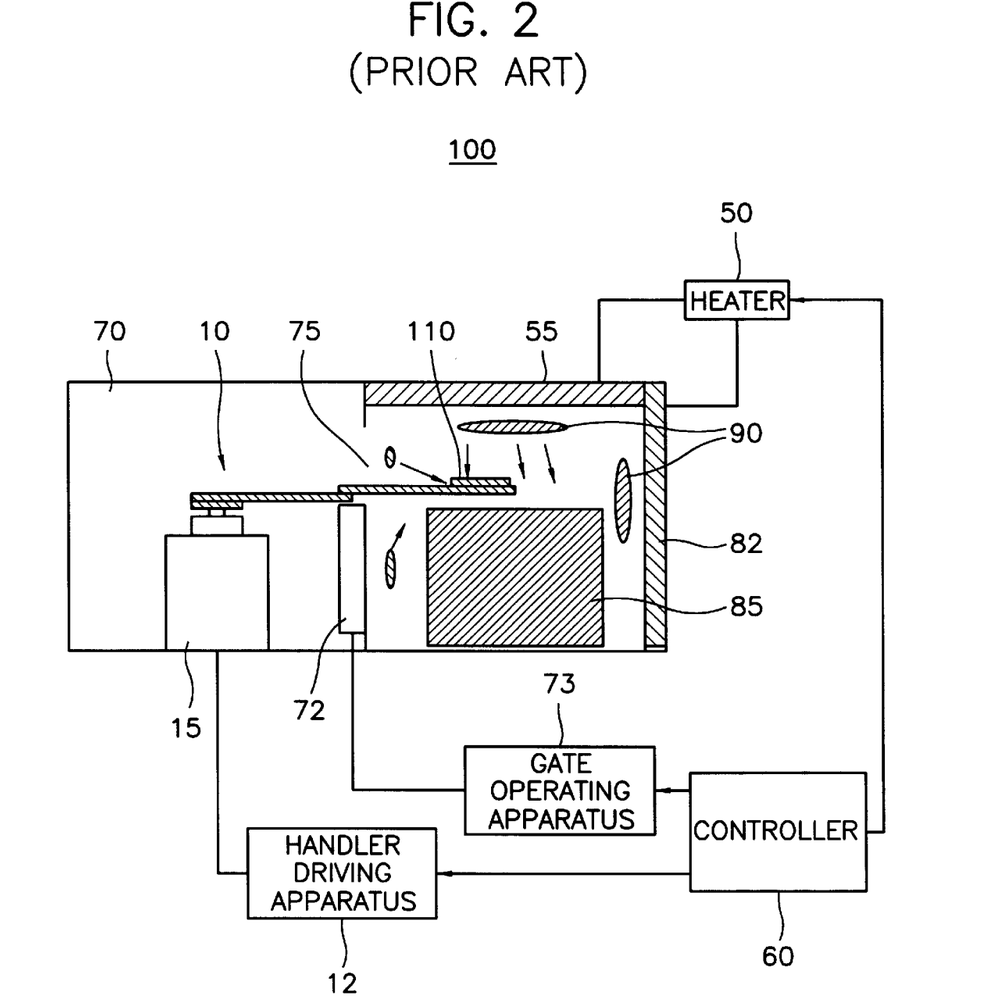
FIG. 2 is a schematic diagram of the conventional semiconductor treatment system in which a handler of the wafer handling apparatus has moved into a process chamber.

FIGS. 1 and 2 show a conventional semiconductor treatment system 100 having a process chamber heating apparatus.

As shown in FIGS. 1 and 2, a conventional semiconductor treatment system 100 has a loadlock chamber 70 having a handler 10 therein, and a process chamber 80 having an electrode 85 therein.

The handler 10 is operated by a handler driving apparatus 12, which is controlled by a controller 60, to thereby convey a wafer 110 stored in a cassette chamber (not shown) onto the electrode 85 of the process chamber 80. A support 15 for supporting the handler is disposed beneath the handler 10.

A gate 72 is installed at a partition between the loadlock chamber 70 and the process chamber 80. The gate 72 is operated by a gate operating apparatus 73, which is controlled by the controller 60, to thereby close/open an inlet 75 formed in the partition.

A lid 55 forming the top of the process chamber 80 is provided with a duct (not shown) for supplying a gas into the process chamber 80. Both the lid 55 and the side wall 82 of the process chamber 80 are connected to a heater 50. The lid 55 and the side wall 82 of the process chamber 80 are heated by the heater 50 so that polymers 90 floating in the process chamber 80 do not stick to the side wall 82 of the process chamber 80. The heater 50 is also controlled by the controller 60.

The conventional semiconductor treatment system 100 having the above-described structure operates as follows.

When the semiconductor manufacturing process begins, the controller 60 issues an operating signal to the handler driving apparatus 12 so that the handler 10 moves into the cassette chamber in which wafers 110 are stored.

Then, the handler 10 grips one wafer 110 using a vacuum and conveys the wafer into the process chamber 80. At this time, the controller 60 issues an electric signal to the gate operating apparatus 73 so that the gate 72 moves down, thereby opening the inlet 75 formed in the partition between the loadlock chamber 70 and the process chamber 80.

The handler 10 moves into the process chamber 80 passing through the inlet 75 and returns to its initial position after placing the wafer 110 onto the electrode 85 disposed in the process chamber 80. At the same time, the controller 60 issues an electric signal to the gate operating apparatus 73 so that the gate 72 moves up, thereby closing the inlet 75.

After the process has finished, the controller 60 again issues an electric signal which directs the gate operating apparatus 73 to open the inlet 75. At the same time, the controller 60 issues an electric signal to the handler driving apparatus 12 which causes the handler to move into the process chamber 80.

Then, the handler 10 grips the wafer 110 using a vacuum and moves into the cassette chamber whereupon the handler 10 places the wafer 110 into a slot of the cassette chamber.

While the above process is being carried out, the controller 60 operates the heater 50 so as that the lid 55 or the side wall 82 of the process chamber 80 is heated, whereby the polymers 90 floating in the process chamber 80 are prevented from sticking to the side wall 82 of the process chamber 80.

However, although the conventional semiconductor system 100 can prevent the polymers 90 from sticking to the side wall 82 of the process chamber 80, it cannot prevent the polymers 90 from sticking to the handler 10.

Typically, the initial temperature of the process chamber, in which a CVD, etching or ion implantation process is carried out, is about 50–120° C. On the other hand, the initial temperature of the handler moving into the precess chamber is about 20–25° C. Thus, polymers floating in the process chamber may stick to the handler 10 when the handler moves into the process chamber.

The polymers which stick to the underside of the handler gradually aggregate as polymer particles, which are then especially likely to fall onto the wafer being treated while the handler moves in the process chamber. Such polymer particles are in fact frequent causes of defects in the semiconductor devices.

For this reason, the handler must be disassembled from the system and cleaned periodically, which action consumes time and labor, and thereby detracts from the efficiency of the semiconductor manufacturing process.

SUMMARY OF THE INVENTION

The present invention has been made to overcome the above-described problems of the prior art. Accordingly, it is an object of the present invention to provide a wafer handling apparatus capable of conveying a wafer into or from a process chamber while preventing polymers from sticking to its handler.

To achieve this object, the wafer handling apparatus comprises a wafer handler, a driving mechanism for moving the wafer handler into and out of a process chamber so that the handler can convey a wafer into or out of the process chamber, and means for controlling the temperature of the handler to one that is substantially identical to the temperature inside the process chamber.

The handler preferably includes an arm which is rotatably driven by the driving mechanism, and an effector which is integral with the arm and supports the wafer during its conveyance. Accordingly, heat will be transferred by conduction between the arm and the effector.

The temperature controlling means may include an electric heater (resistive heater) and current supplying apparatus which intermittently supplies current to the heating coil. The electric heater may be either a heating coil accommodated in the effector or at least one pair of thermo-electric heating pads mounted to the bottom of the effector.

The current supplying apparatus may comprise a power source, a relay switch having a first end connected to the heater and a second end connected to the power source, and a controller for applying on/off signals to the relay switch.

With the heater being controlled to heat the handler to a temperature substantially identical to that inside the process chamber, polymers floating in the process chamber are prevented from sticking to the handler.

BRIEF DESCRIPTION OF THE DRAWINGS

The above and other objects, features and advantages of the present invention will become more apparent by referring to the detailed description of the preferred embodiments thereof made with reference to the attached drawings, of which.

DETAILED DESCRIPTION OF THE PREFERRED EMBODIMENTS

Hereinafter, the present invention will be described in detail with reference to the accompanying drawings.
Embodiment 1

Figure 3:
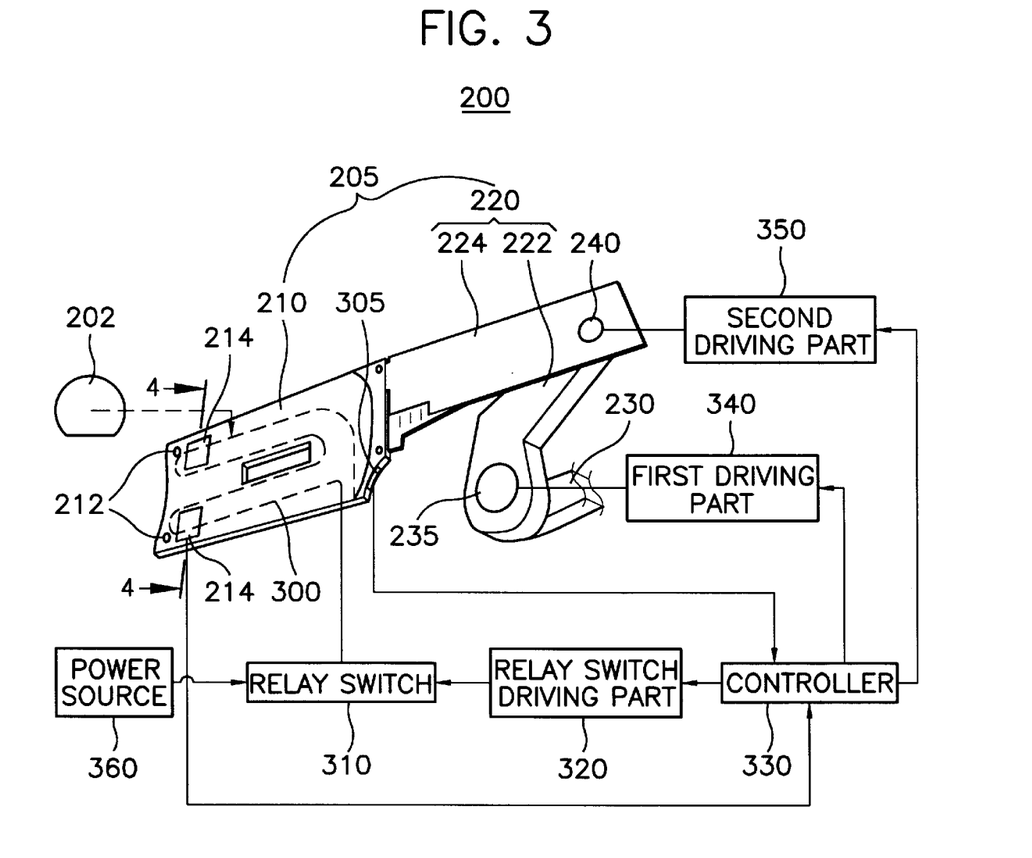
FIG. 3 is a perspective view of a first embodiment of a wafer handling apparatus according to the present invention.

Referring to FIG. 3, the wafer handling apparatus 200 has a handler 205. The handler 205 conveys a wafer 202 between a cassette chamber and a process chamber. Typically, the handler 205 is installed in a loadlock chamber interposed between the process chamber and the cassette chamber and is rotatably supported by a support member 230. The handler 205 includes an arm 220 and an effector 210 which is integral with a terminal end of the arm 220.

The wafer 202 to be conveyed is placed on an upper surface of the effector 210. Preferably, the arm 220 and effector 210 are made of thermally conductive material so that a heat exchange is effected therebetween.

A pair of suction holes 212 are formed at an end portion of the effector 210. The suction holes 212 are connected to a vacuum pump (not shown) through a vacuum hose (also not shown). When the wafer 202 is conveyed, the suction holes 212 are located just beneath the wafer 202 so that the underside of the wafer 202 is drawn against the effector 210 by the vacuum created in the holes 212, whereby the wafer 202 is secured to the end effector 210.

Reference numeral 214 designates a wafer detecting sensor. The wafer detecting sensor 214 is connected to a controller 330 and detects whether the wafer 202 is present on the effector 210.

The arm 220 includes a first arm portion 222 and a second arm portion 224. The first arm portion 222 is rotatably coupled to the support 230 by a first rotating shaft 235. The second arm portion 224 is rotatably coupled to a terminal end of the first arm portion 222 by a second rotating shaft 240. In addition, the handling apparatus 200 comprises a driving mechanism including a first rotary driving part 340 connected to the first rotating shaft 235 for driving the first rotating shaft 235, and a second rotary driving part 350 connected to the second rotating shaft 240 for driving the second rotating shaft 240.

The first and second rotary driving parts 340 and 350 are controlled by the controller 330 to thereby rotate the first and second rotating shafts 235 and 240 and thus operate the first and second arm portions 222 and 224. The first rotary driving part 340 may comprise a motor for generating a driving force and a pulley (not shown) for transferring the driving force of the first motor to the first rotating shaft 235. The second rotary driving part 350 may also comprise a motor for generating a driving force and a pulley for transferring the driving force of the second motor to the second rotating shaft 240. Alternatively, timing belts can be used instead of the pulleys, and the first and second rotating shafts 235 and 240 can be selectively operated by one motor.

The wafer handling apparatus 200 also has a temperature control system for maintaining the temperature of the handler 205 to one that is identical to the temperature inside the process chamber to which the wafer 202 is conveyed. The temperature control system includes a heating coil 300 accommodated in the effector 210 and current supplying apparatus which intermittently supplies current to the heating coil 300, thereby maintaining the temperature of the end effector 210 at a predetermined temperature.

The current supplying apparatus comprises a relay switch 310 having a first end connected to the heating coil 300 and a second end which is connected to a power source 360, a relay switch driver 320 for operating the relay switch 310, and the controller 330 which issues on/off signals to the relay switch driver 320. The relay switch driver 320 is an excitement coil which is typically integrated with the relay switch 310.

Figure 4:
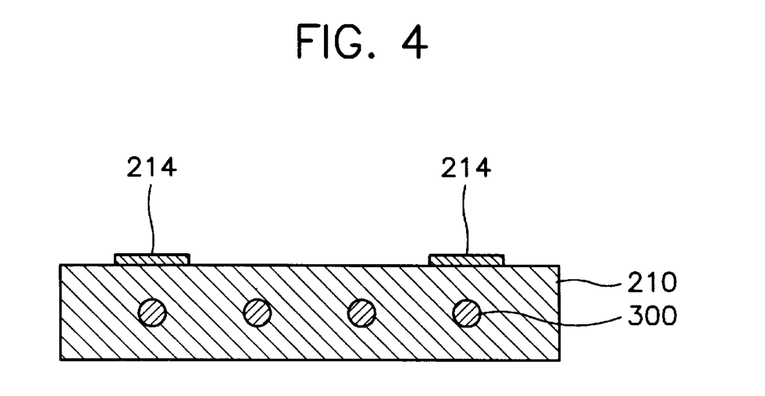
FIG. 4 is a sectional view of the first embodiment of the wafer handling apparatus as taken along line 4—4 shown in FIG. 3.

Referring now to FIG. 4, the heating coil 300 is preferably accommodated in the effector 210 by an insert-molding process. The insert-molding process is a molding technique in which the heating coil 300 is first placed in a mold and raw material for forming the effector 210 is then injected into the mold.

The inserting-molding process produces a secure coupling between the effector 210 and the heating coil 300 and yields a high degree of heat-exchange efficiency between the effector 210 and the heating coil 300. Preferably, the heating coil 300 is uniformly distributed throughout the entirety of the effector 210. For instance, the heating coil 300 loops along the interior of the effector 210.

The wafer handling apparatus 200 further comprises a temperature sensor 305 for sensing the temperature of the effector 210. The temperature sensor 305 produces signals indicative of the temperature of the effector 210 and which signals are issued to the controller 330. The controller 330 operates the relay switch driver 320 based on the temperature detected by the detecting sensor 305 and based on the temperature inside the process chamber.

The wafer handling apparatus 200 having the structure described above operates as follows.

First, when the semiconductor manufacturing process begins, the controller 330 operates the relay switch driver 320 so that current is supplied to the heating coil 300 until the temperature of the handler 205 reaches the temperature inside the process chamber.

As the current flows through the heating coil 300, the effector 210, in which the heating coil 30 is accommodated, is first heated and the temperature of arm 220 connected to the end effector 210 is also thereby increased. Therefore, polymers floating in the process chamber will not stick to the effector 210. When some portion of the arm 220 enters the process chamber together with the effector 210, polymers do not stick to the arm portion because the temperature of the arm portion has been raised.

The controller 330 adjusts the temperature of the effector 210 according to the conditions of the process chamber to which the wafer 202 is conveyed. For example, if the wafer 202 is conveyed to a process chamber in which a CVD process will be carried out, the controller 330 adjusts the temperature of the effector 210 to 50–7° C. On the other hand, if the wafer 202 is conveyed to a process chamber in which an etching process or ion implantation process is to be carried out, the temperature of the effector 210 is set to the temperature at which the etching or ion implantation process occurs.

Figure 7A:
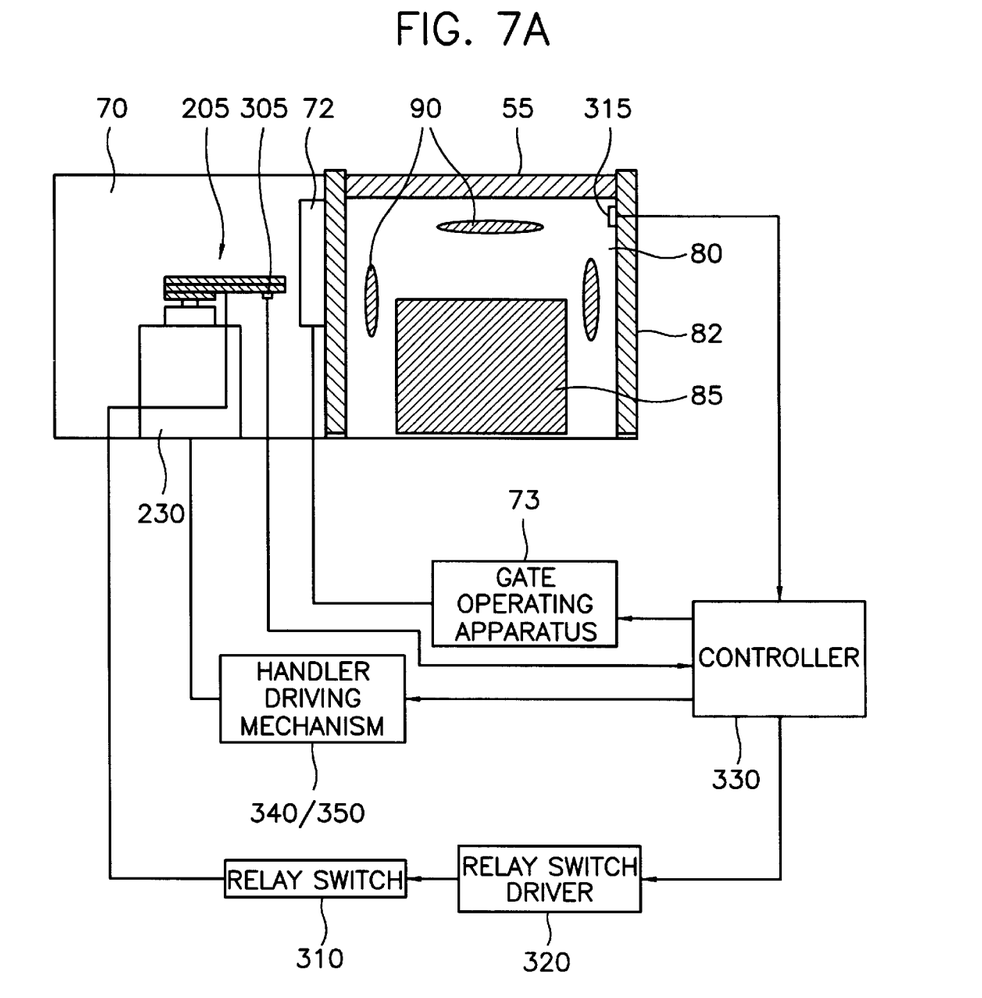
FIG. 7A is a schematic diagram of one form of a wafer treatment system equipped with the wafer handling apparatus according to the present invention.
Figure 7B:
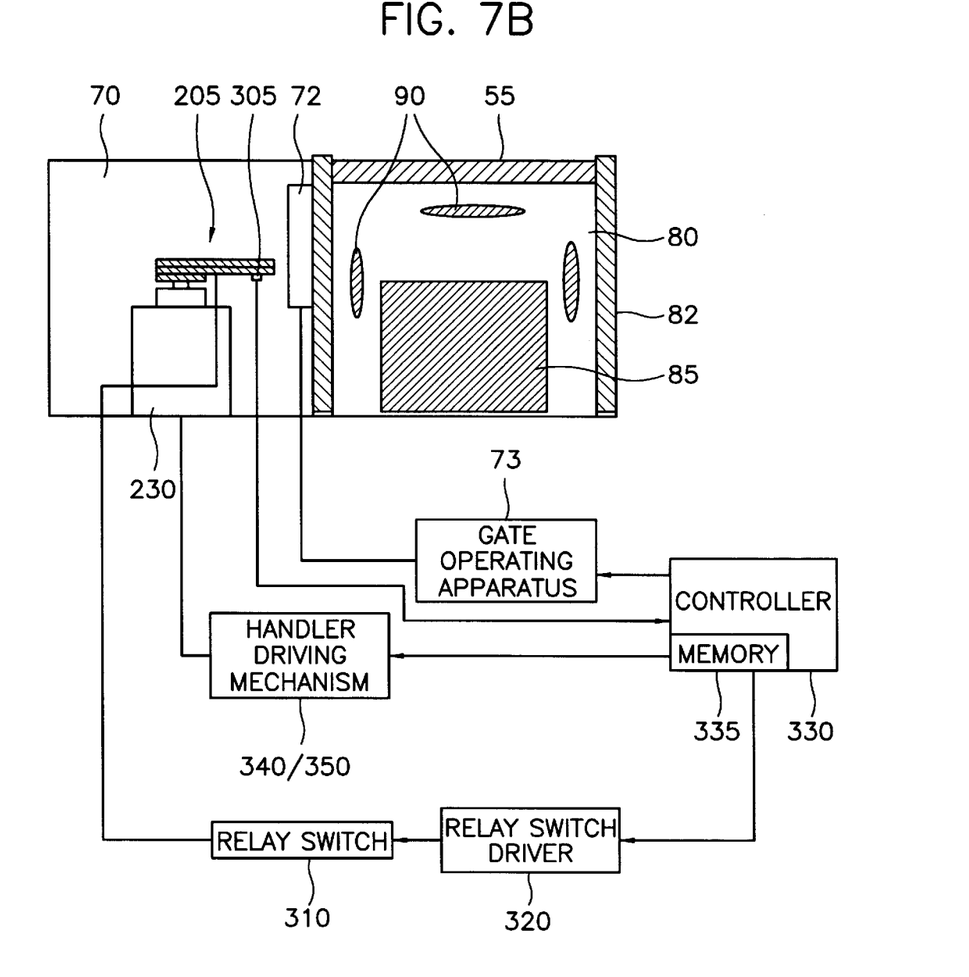
FIG. 7B is a schematic diagram of another form of a wafer treatment system equipped with the wafer handling apparatus according to the present invention .

More specifically, the temperature of the effector 210 can be set based on temperature data inputted from a temperature sensor 315 disposed in the process chamber (FIG. 7A). Alternatively, the temperature of the effector 210 can be pre-set based on temperature data derived through a number of experiments carried out to predetermine the temperature that will exist in the process chamber. The temperature data is stored in a memory 335 of the controller 330 (FIG. 7B).

While the heating process is being carried out, the temperature sensor 305 provided on the proximal end of the effector 210 detects the temperature of the effector 210 and sends the temperature data to the controller 330. If the temperature data received from the temperature sensor 305 has a value exceeding a predetermined temperature value derived from the sensed temperature within the process chamber (FIG. 7A) or the stored temperature data (FIG. 7B), the controller 330 stops the relay switch driver 320 from operating. On the other hand, if the temperature data received from the temperature sensor 305 has a value below the predetermined temperature value, the controller 330 operates the relay switch driver 320 so as to increase the temperature of the effector 210 to the predetermined temperature.

When the temperature of the effector 210 is substantially identical to the temperature inside the process chamber, the controller 330 issues electric signals to the first and second driving parts 340 and 350 so as to rotate the first and second rotating shafts 235 and 240. Accordingly, the first and second arm portions 222 and 224 of the handler 205 coupled to the first and second rotating shafts 235 and 240 are moved, whereby the effector 210 enters the cassette chamber. The movement of the handler 205 is effected according to an algorithm which is pre-set in the controller 330.

The effector 210 is moved into contact with the underside of the wafer 202 stored in the cassette chamber. At this time, the controller 330 operates the vacuum pump so that suction is created in the vacuum holes 212 formed at distal end of the effector 210. Accordingly, the wafer 202 is held stably on the effector 210. In addition, the wafer detecting sensor 214 provided on the upper surface of the effector 210 detects for the presence of the wafer 202 on the effector 210.

If the wafer 202 is in place, the controller 330 issues electric signals to both the first and second rotary driving mechanisms 340 and 350 according to the algorithm which is pre-set therein, whereby the effector 210 of the handler 205 is moved into the process chamber.

At this time, because the effector 210 conveyed into the process chamber has a temperature substantially identical (identical considering the detection error) to the temperature inside the process chamber, polymers floating in the process chamber will not stick to the effector 210. In addition, even when some portion of the arm 220 enters the process chamber together with the effector 210, the polymers will not stick to the arm portion because the temperature of the arm portion has been raised by the end effector 210.

Then, the handler 205 sets the wafer 202 on the electrode installed in the process chamber. At this time, the controller 330 can determine whether the wafer 202 is on the electrode by the signal inputted from the wafer detecting sensor 214. If the wafer 202 is determined to be on the electrode, the controller 330 operates the first and second rotary driving mechanisms 340 and 350 in a manner which causes the handler 205 to return to its initial position.

Embodiment 2

Figure 5:
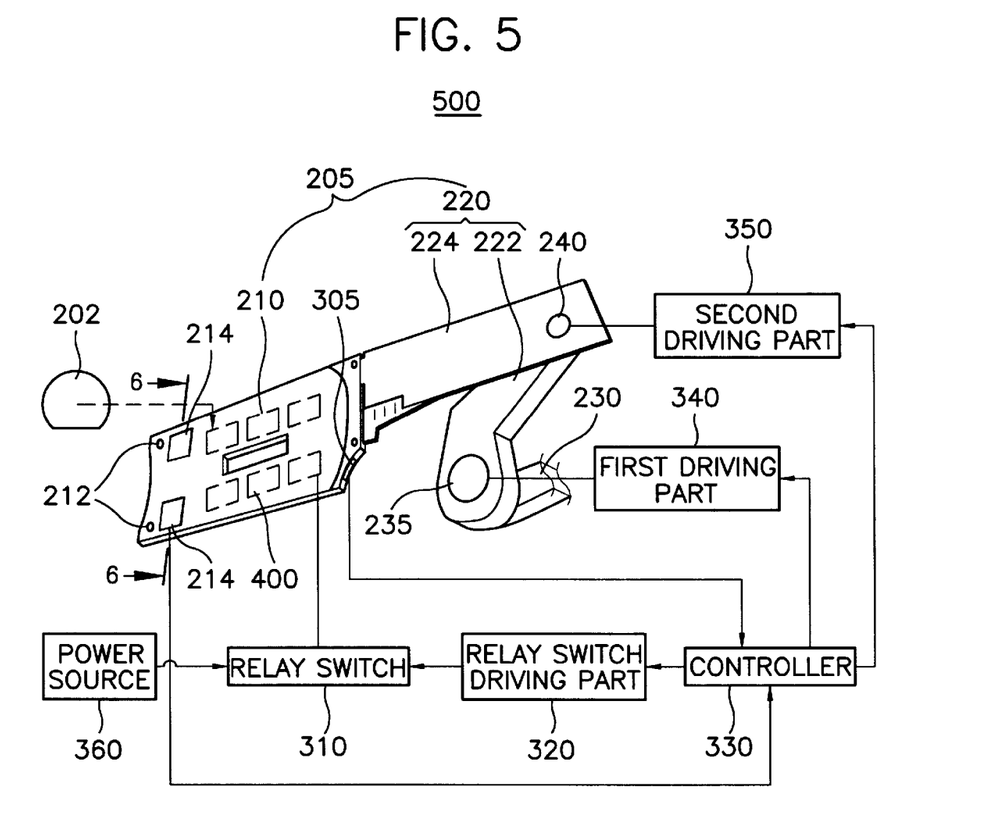
FIG. 5 is a perspective view of a second embodiment of a wafer handling apparatus according to the present invention.

FIG. 5 shows another embodiment of the wafer handling apparatus 500 according to the present invention. Elements identical to those of the first embodiment are designated by the same reference numerals.

In this embodiment, at least one pair of heating pads 400 are attached to the end effector 205 instead of a heating coil.

However, similar to the first embodiment, current is intermittently supplied to the heating pads 400 through the relay switch 310 which is controlled by the controller 330. The number of heating pads 400 is selected according to the surface area of the end effector 205.

Figure 6:
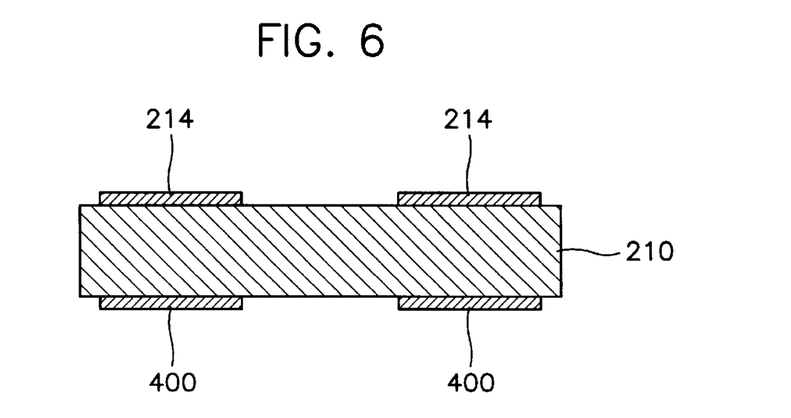
FIG. 6 is a sectional view of the second embodiment of the wafer handling apparatus as taken along line 6—6 shown in FIG. 5.

As shown in detail in FIG. 6, the heating pads 400 are preferably attached to the underside of the effector 205 because the wafer 202 is placed on the upper surface of the effector 205. However, if required, the heating pads 400 can be attached on the upper surface of the effector 205. Preferably, an ultra-violet bonding method is used to attach the heating pads 400 to the underside/upper surface of the effector 205.

The heating pads 400 comprise a pair of thermo-electric plates which generate heat when current is supplied thereto. In addition, the heating pads 400 are preferably made of a ceramic material which has a high heating efficiency and can be easily fabricated as a thin film.

The operation of the second embodiment of the wafer handling apparatus 500 is substantially identical to that of the first embodiment and thus, for the sake of brevity, will not be explained.

As described above, the wafer handling apparatus of the present invention prevents polymers from sticking to the handler. Hence, the handler is durable and will not serve as a cause of defects in the semiconductor devices.

In addition, the wafer handling apparatus of the present invention does not require frequent and periodic cleaning, i.e. does not consume large amounts of time and labor in connection with its maintenance. Thus, the present invention contributes to the efficiency and productivity of the semiconductor fabrication process.

Although the present invention has been particularly shown and described above with reference to the preferred embodiments thereof, it will be understood by those skilled in the art that various changes may be effected therein without departing from the spirit and scope of the invention as defined by the appended claims.

What is claimed is:

1. A wafer handling apparatus comprising:
    a wafer handler having a wafer chuck capable of securing a wafer thereto;
    a support member to which said handler is movably mounted;
    a driving mechanism connected to said handler and operative to move said handler for transferring a wafer secured thereto by said wafer chuck; and
    a temperature control system which includes a heater integral with said handler so as to heat said handler, and a controller operatively connected to said heater so as to control the amount of heat produced by said heater.

2. A wafer handling apparatus as claimed in claim 1, wherein said heater is an electric heater which produces heat when electric current is supplied thereto, and said controller is configured to supply current intermittently to said heater.

3. A wafer handling apparatus as claimed in claim 1, wherein said handler includes an arm which is rotatably mounted to said support member, and an effector integral with said arm at one end thereof, said effector comprising the wafer chuck, and said heater being integrated with said effector, whereby said heater heats said effector and said arm is heated by heat conducted thereto from said effector.

4. A wafer handling apparatus as claimed in claim 3, wherein said heater is a heating coil extending within said effector.

5. A wafer handling apparatus as claimed in claim 4, wherein the heating coil is insert-molded within said effector.

6. A wafer handling apparatus as claimed in claim 4, wherein said heating coil loops about said effector.

7. A wafer handling apparatus as claimed in claim 4, wherein said temperature control system also includes a relay switch having a first end connected to said heating coil and a second end connected to a power source, and wherein said controller is configured to issue on/off signals to control said relay switch.

8. A wafer handling apparatus as claimed in claim 7, wherein said temperature control system also includes a temperature sensor attached to said handler and operatively connected to said controller so as to issue signals thereto indicative of the temperature of the handler at a given location, and wherein said controller is configured to intermittently operate said relay switch based on the temperature of the handler sensed by said temperature sensor.

9. A wafer handling apparatus as claimed in claim 8, wherein said temperature sensor is attached to an end of said effector adjacent said arm of the handler.

10. A wafer handling apparatus as claimed in claim 3, wherein said heater comprises at least one pair of heating pads attached to said effector.

11. A wafer handling apparatus as claimed in claim 10, wherein said heating pads are made of a ceramic material and are disposed at a lower side of said effector.

12. A wafer handling apparatus as claimed in claim 10, wherein said heating pads comprise a pair of thermo-electric plates.

13. A wafer handling apparatus as claimed in claim 10, wherein said temperature control system also includes a relay switch having a first end connected to the heating pads and a second end connected to a power source, and wherein said controller is configured to issue on/off signals to control said relay switch.

14. A wafer handling apparatus as claimed in claim 13, wherein said temperature control system further includes a temperature sensor attached to said handler and operatively connected to said controller so as to issue signals thereto indicative of the temperature of the handler at a given location, and wherein said controller is configured to intermittently operate said relay switch based on the temperature of the effector sensed by said temperature sensor.

15. A wafer handling apparatus as claimed in claim 14, wherein said temperature sensor is attached to an end of said effector adjacent said arm of the handler.

16. The combination of a processing chamber in which a wafer is processed, and wafer handling apparatus for transferring the wafer, wherein said wafer handling apparatus comprises:
    a wafer handler having a wafer chuck capable of securing a wafer thereto;
    a support member disposed outside of said processing chamber and to which said handler is movably mounted;
    a driving mechanism connected to said handler and operative to move said handler into said process chamber; and
    a temperature control system which includes a heater integral with said handler so as to heat said handler, a first temperature sensor attached to said handler so as to sense the temperature thereof at a given location, and a controller operatively connected to said temperature sensor, said heater and said drive mechanism so as to control the heater to maintain the temperature of said handler to one substantially identical to the temperature inside said process chamber at the time the handler is moved by said driving mechanism into said process chamber.

17. The combination as claimed in claim 16, and further comprising a second temperature sensor disposed in said process chamber and operatively connected to said controller, and wherein said controller controls said heater on the basis of the temperatures sensed by said first and second temperature sensors.

18. The combination as claimed in claim 16, wherein said controller has data stored therein representative of conditions of the process carried out in said process chamber, and said controller controls said heater on the basis of the temperature sensed by said first temperature sensor and said stored data.

19. The combination as claimed in claim 16, wherein said heater is an electric heater which produces heat when electric current is supplied thereto, and said controller is configured to supply current intermittently to said heater.

20. The combination as claimed in claim 19, wherein said temperature control system also includes a relay switch having a first end connected to said heating coil and a second end connected to a power source, and wherein said controller is configured to issue on/off signals to control said relay switch.

* * * * *